US006275524B1

(12) United States Patent
Spagna

(10) Patent No.: US 6,275,524 B1
(45) Date of Patent: Aug. 14, 2001

(54) APPARATUS AND METHOD FOR REDUCING THE TIME REQUIRED TO ACQUIRE SYNCHRONIZATION WITH AN INCOMING DATA STREAM

(75) Inventor: Fulvio Spagna, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/239,760

(22) Filed: Jan. 29, 1999

(51) Int. Cl.[7] .............................. H03H 7/30; H03H 7/40; H03K 5/159; H03D 3/24
(52) U.S. Cl. ...................... 375/229; 375/375; 327/159
(58) Field of Search ...................... 375/229, 230, 375/232, 233, 235, 354, 355, 359, 362, 371, 373, 375, 376; 455/260, 264; 327/155, 156, 159; 713/400, 500

(56) References Cited

U.S. PATENT DOCUMENTS

| 4,028,626 | * | 6/1977 | Motley et al. | 375/235 |
| 4,906,941 | * | 3/1990 | Kato et al. | 327/159 |
| 5,001,482 | * | 3/1991 | Chung et al. | 341/136 |
| 5,802,123 | * | 9/1998 | Yoshimura et al. | 375/376 |
| 5,870,591 | * | 2/1999 | Sawada | 713/500 |
| 5,872,815 | * | 2/1999 | Strolle et al. | 375/321 |
| 6,191,716 | * | 2/2001 | Staszewski | 341/139 |
| 6,201,832 | * | 3/2001 | Choi | 375/233 |

* cited by examiner

Primary Examiner—Stephen Chin
Assistant Examiner—Lenny Jiang
(74) Attorney, Agent, or Firm—W. Daniel Swayze, Jr.; W. James Brady; Frederick J. Telecky, Jr.

(57) ABSTRACT

The inventive apparatus includes a first filter which receives an analog-based input signal and a feedback signal, performs equalization on the analog-based input signal and the feedback signal, and outputs an equalized signal based on the analog-based input signal and the feedback signal. The first filter may include an analog finite impulse response filter. The apparatus also includes an analog to digital converter which receives the equalized signal and outputs a digital signal converted from the equalized signal in accordance with the feedback signal. In addition, the apparatus includes a phase detector which receives the digital signal, detects a phase difference therefrom and outputs a signal corresponding to a magnitude of the phase difference. The apparatus also includes a second filter and a voltage controlled oscillator. The second filter receives and filters the signal corresponding to a magnitude of the phase difference and outputs a filtered signal corresponding to a magnitude of the phase difference. The voltage controlled oscillator receives the filtered signal corresponding to a magnitude of the phase difference and outputs the feedback signal. The first filter performs equalization on the analog-based input signal and feedback signal in accordance with a function defined by an expression having a plurality of coefficients including a first coefficient. Significantly, only the first coefficient of the plurality of coefficients is set equal to a value of one and any remaining coefficients of the plurality of coefficients are set to a value of zero.

15 Claims, 7 Drawing Sheets

APPARATUS AND METHOD FOR REDUCING THE TIME REQUIRED TO ACQUIRE SYNCHRONIZATION WITH AN INCOMING DATA STREAM

BACKGROUND OF THE INVENTION

1. Field of the Invention

The present invention relates generally to a direct storage access device of the type utilizing partial-response signaling and maximum-likelihood (PRLM) detection together with digital filtering. More particularly, the present invention relates to an apparatus and method for reducing the time required to acquire synchronization with an incoming data stream.

2. Description of Related Art

Computers often include auxiliary memory storage units, such as disk drives, having media upon which data can be stored and later retrieved. Disk drives include magnetic rotating disks typically having concentric, radially-spaced tracks arranged on the surface of each disk, with data sectors being recorded on each track. A signal pick-up head moves over the surface of each disk to read or write data on the tracks of that disk.

A portion of the data written on the disk is used to recover timing information when the data is later read. The recovery of this timing information is performed using a phase locked loop (PLL) so that the sampling of data can be properly timed.

There are typically two modes of disk drive operation, acquisition mode and tracking mode. During the acquisition mode, the precise timing for data sampling is determined. In this regard, the PLL performs frequency lock-in by adjusting its free-running frequency to match the frequency of the incoming data. Thereafter, a phase lock-in sequence is performed where the PLL controls the phase of the clock so that it aligns with the phase of the incoming data signal.

The sampled data includes a preamble. This preamble is typically periodic in nature and contains many transitions (i.e. it has a high content of timing information). The preamble is used to facilitate the synchronization of the PLL with the incoming data. Because the size of the preamble adversely impacts disk format efficiency, it is highly desirable to reduce its length. Although the acquisition time must be decreased to reduce the length of the preamble, any reduction in the acquisition time is ultimately limited by the latency of the PLL, with a higher latency resulting in a longer acquisition time.

In addition, a higher latency makes it more difficult to use the PLL under optimal conditions. FIG. 1a shows the stability region of such a system for different latency values as a function of two loop parameters: the gain of the integral path (INTGAIN) and the gain of the proportional path (PROPGAIN). FIG. 1b shows in greater detail the stability region of FIG. 1a. FIG. 2a shows the acquisition time profile of a PLL system without latency. FIG. 2b shows the acquisition time profile of a PLL system with latency. The useful operating range of a PLL system with latency is much more restricted than a system without latency, making it more difficult to accommodate part to part variations. The settling time defines the acquisition time length required to reduce the PLL phase error to ±1 least significant bit (LSB).

Each of the elements of a PLL system has its own inherent latency. Therefore, to achieve a reduction in acquisition time, the latency of the PLL system must be reduced.

One technique used to reduce the latency of the PLL system is to bypass the finite impulse response (FIR) filter during the acquisition phase. An example of this particular technique is illustrated in U.S. Pat. No. 5,220,466.

The equalization provided by the FIR filter can be avoided during the acquisition phase because of the periodic nature of the preamble. By avoiding the use of the FIR filter during the acquisition phase, the latency of the PLL system can be diminished, thereby decreasing the overall acquisition time through the use of a shorter preamble. As a result, the disk format efficiency is increased.

Even when "aided" acquisition techniques are employed to reduce the "acquisition" time, one is still confronted by the problem of latency, which can still decrease the effectiveness of those techniques. By way of example, an auxiliary circuit may be employed as a zero phase restart to jump start the clock in an accurate phase alignment with the incoming data. However, the latency of the PLL system will degrade the effectiveness of this technique due to the presence of an unavoidable frequency offset between the clock and incoming data. As a slight improvement on this technique, the auxiliary circuit may be used in conjunction with the bypassing technique discussed above because the effectiveness of this circuit, as well as that of other "aided" acquisition techniques, is reduced by the latency of the PLL system due to the presence of the frequency offset between the clock and the incoming data signal.

In view of the foregoing, a technique for reducing the acquisition time is needed which minimizes the latency of the PLL system.

SUMMARY OF THE INVENTION

In accordance with one embodiment of the present invention, an apparatus is provided including a first filter which receives an analogbased input signal and a feedback signal, performs equalization on the analog-based input signal and the feedback signal, and outputs an equalized signal based on the analog-based input signal and the feedback signal.

The apparatus also includes an analog to digital converter which receives the equalized signal and outputs a digital signal converted from the equalized signal in accordance with the feedback signal. In addition, the apparatus includes a phase detector which receives the digital signal, detects a phase difference therefrom and outputs a signal corresponding to a magnitude of the phase difference.

The apparatus also includes a second filter and a voltage controlled oscillator. The second filter receives and filters the signal corresponding to a magnitude of the phase difference and outputs a filtered signal corresponding to a magnitude of the phase difference. The voltage controlled oscillator receives the filtered signal corresponding to a magnitude of the phase difference and outputs the feedback signal.

The first filter performs equalization on the analog based input signal and the feedback signal in accordance with a function defined by an expression having a plurality of coefficients including a first coefficient. Significantly, only the first coefficient of the plurality of coefficients is set equal to a value of one and any remaining coefficients of the plurality of coefficients are set equal to a value of zero.

According to one aspect of the embodiment described above, the first filter may include an analog finite impulse response filter.

According to another aspect of the embodiment described above, the feedback signal may be a PLL clock signal.

According to still yet another aspect of the embodiment described above, the equalized signal is a product of the analog-based input signal and the feedback signal.

In accordance with a second embodiment of the present invention, an apparatus is provided which includes an analog to digital converter which receives an analog-based input signal and a feedback signal and outputs first and second digital signals converted from the analog-based input signal and the feedback signal, respectively.

The apparatus also includes a first filter which receives the first and second digital signals, performs equalization on the first and second digital signals and outputs an equalized signal based on the first and second digital signals. The apparatus also further includes a phase detector and a voltage controlled oscillator. The phase detector receives the equalized signal, detects a phase difference therefrom and outputs a signal corresponding to a magnitude of the phase difference. The voltage controlled oscillator receives the filtered signal corresponding to a magnitude of the phase difference and outputs the feedback signal.

The apparatus also includes a second filter which receives and filters the signal corresponding to a magnitude of the phase difference and outputs a filtered signal corresponding to a magnitude of the phase difference.

The first filter performs equalization on the first and second digital signals in accordance with a function defined by an expression comprising a plurality of coefficients including a first coefficient. Significantly, only the first coefficient of the plurality of coefficients is set equal to a value of one and any remaining coefficients of the plurality of coefficients are set equal to a value of zero.

According to one aspect of the second embodiment described above, the first filter may include a digital filter.

According to another aspect of the second embodiment described above, the first filter may include a digital finite impulse response filter.

According to yet another aspect of the second embodiment described above, the feedback signal may be a PLL clock signal.

According to still yet another aspect of the second embodiment described above, the equalized signal may be a product of the first and second digital signals.

In accordance with a third embodiment of the present invention, a method is provided for reducing the time required to acquire synchronization with an incoming data stream.

The method includes the steps of receiving an analog-based input signal and a feedback signal and performing equalization on the analogbased input signal and the feedback signal to produce an equalized signal based on the analog-based input signal and the feedback signal, and converting the equalized signal into a digital signal in accordance with the feedback signal.

The method also includes the steps of detecting a phase difference from the digital signal, generating a signal corresponding to a magnitude of the phase difference, filtering the signal corresponding to a magnitude of the phase difference and producing a filtered signal corresponding to a magnitude of the phase difference. The method further includes the step of generating the feedback signal based on the filtered signal corresponding to a magnitude of the phase difference.

The step of performing equalization is performed in accordance with a function defined by an expression having a plurality of coefficients including a first coefficient. Significantly, the first coefficient is an only one of the plurality of coefficients which is set equal to a value of one and any remaining coefficients of the plurality of coefficients are set equal to a value of zero.

In accordance with a fourth embodiment of the present invention, a method is provided including the steps of receiving an analog-based input signal and a feedback signal, converting the analog-based input signal and feedback signal into first and second digital signals, respectively. The method also includes the steps of performing equalization on the first and second digital signals and generating an equalized signal based on the first and second digital signals. The method further includes the steps of detecting a phase difference from the equalized signal and generating a signal corresponding to a magnitude of the phase difference.

In addition, the method includes the steps of filtering the signal corresponding to a magnitude of the phase difference, producing a filtered signal corresponding to a magnitude of the phase difference and generating the feed back signal based on the filtered signal corresponding to a magnitude of the phase difference.

The step of performing equalization is performed in accordance with a function defined by an expression having a plurality of coefficients including a first coefficient. Significantly, the first coefficient is an only one of the plurality of coefficients set equal to a value of one and any remaining coefficients of the plurality of coefficients are set equal to a value of zero.

It is to be understood that both the foregoing general description and the following detailed description are exemplary and explanatory and are intended to provide further explanation of the invention as claimed.

BRIEF DESCRIPTION OF THE DRAWINGS

These and other features, aspects and advantages of the present invention will become better understood with reference to the following description, appended claims, and accompanying drawings, in which:

FIG. 1b shows a more detailed view of the stability region shown in FIG. 1a.

DETAILED DESCRIPTION OF THE PREFERRED EMBODIMENTS

The present invention is directed to an apparatus and method for reducing the time required to acquire synchronization with an incoming data stream retrieved from of a magnetic disk which is employed in a hard disk drive system, as described below. By way of example, the incoming data stream may be an analog-based input signal.

Figure 1A:
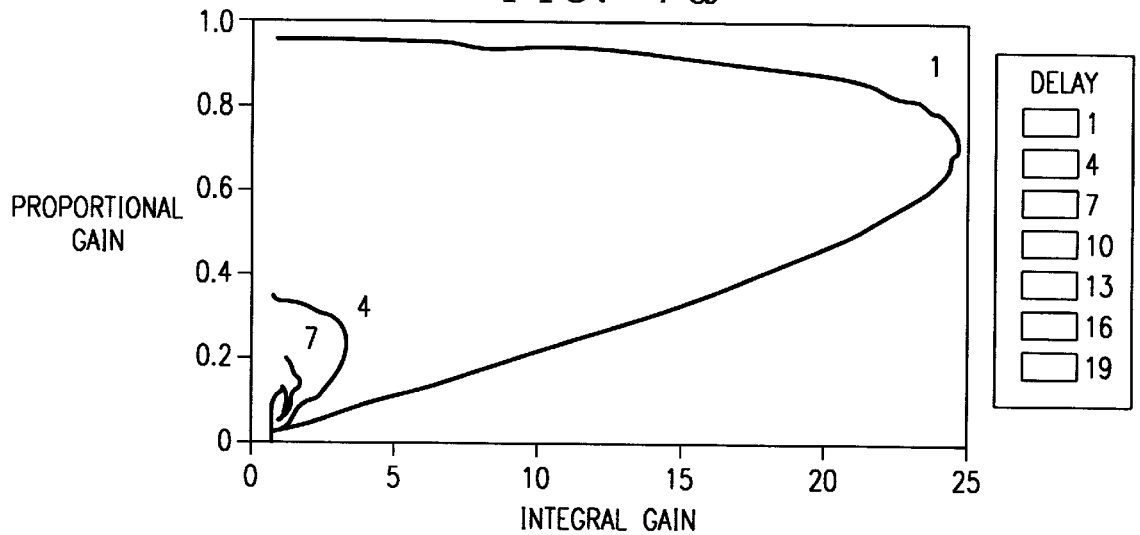
FIG. 1a shows the stability region of a system for different latency values as a function of two loop parameters.
Figure 1B:
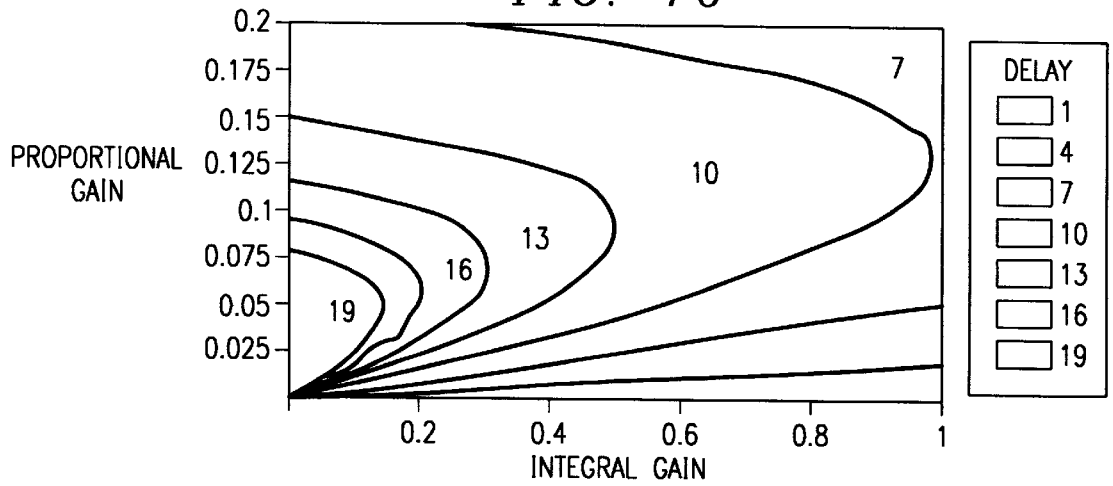
Figure 2A:
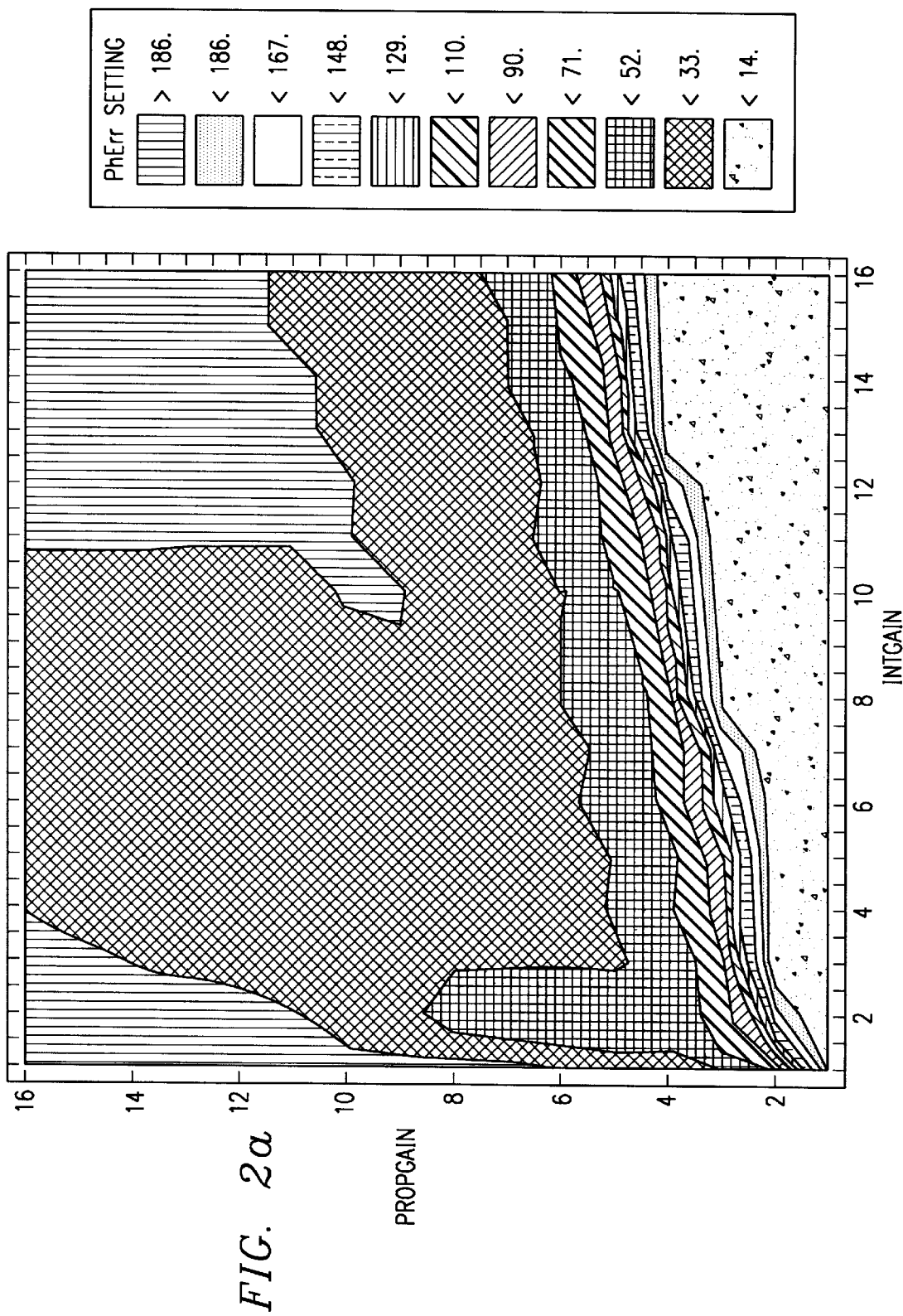
FIG. 2a shows an acquisition timing profile of a PLL system without latency.
Figure 2B:
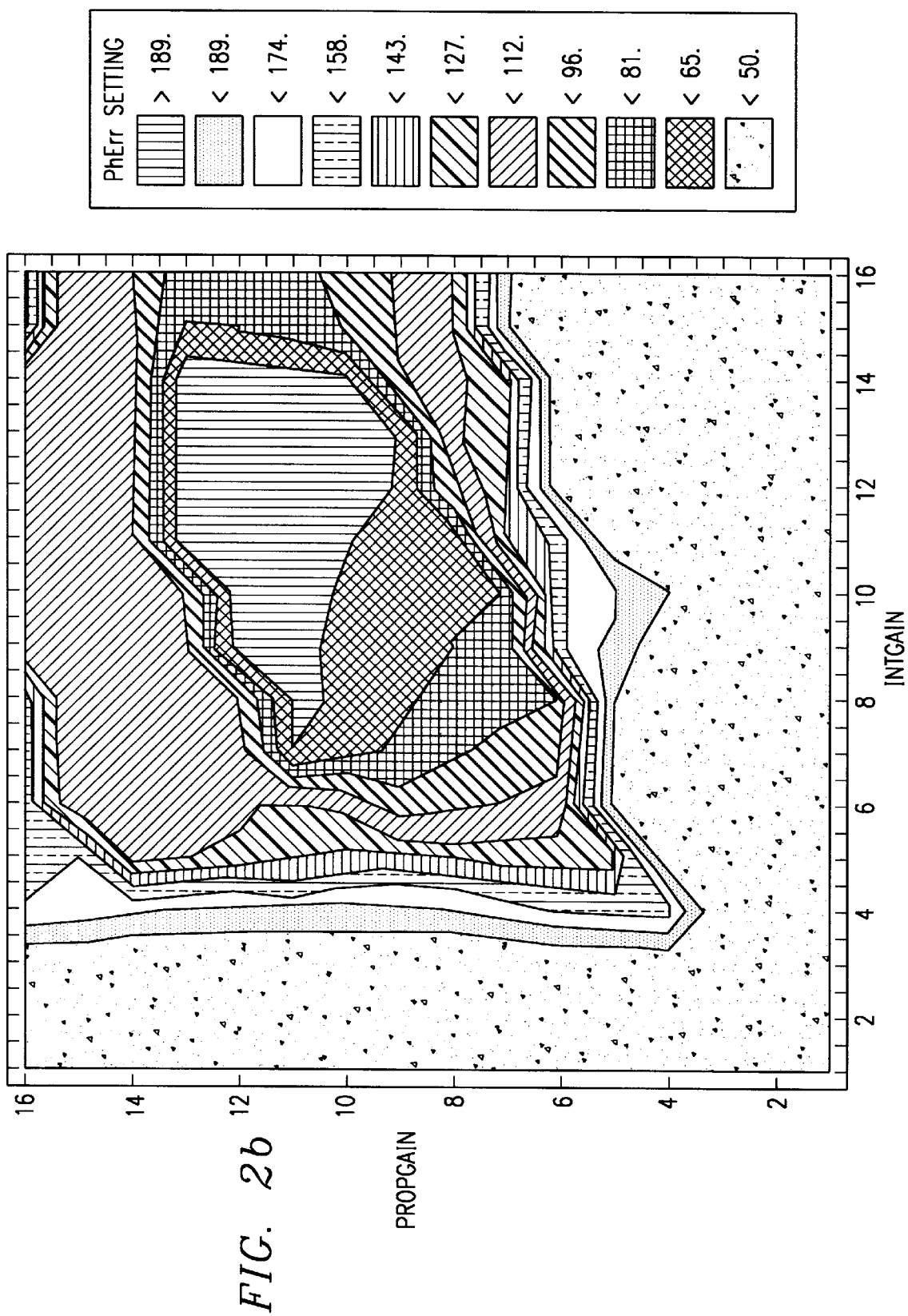
FIG. 2b shows an acquisition timing profile of a PLL system with latency.
Figure 3:
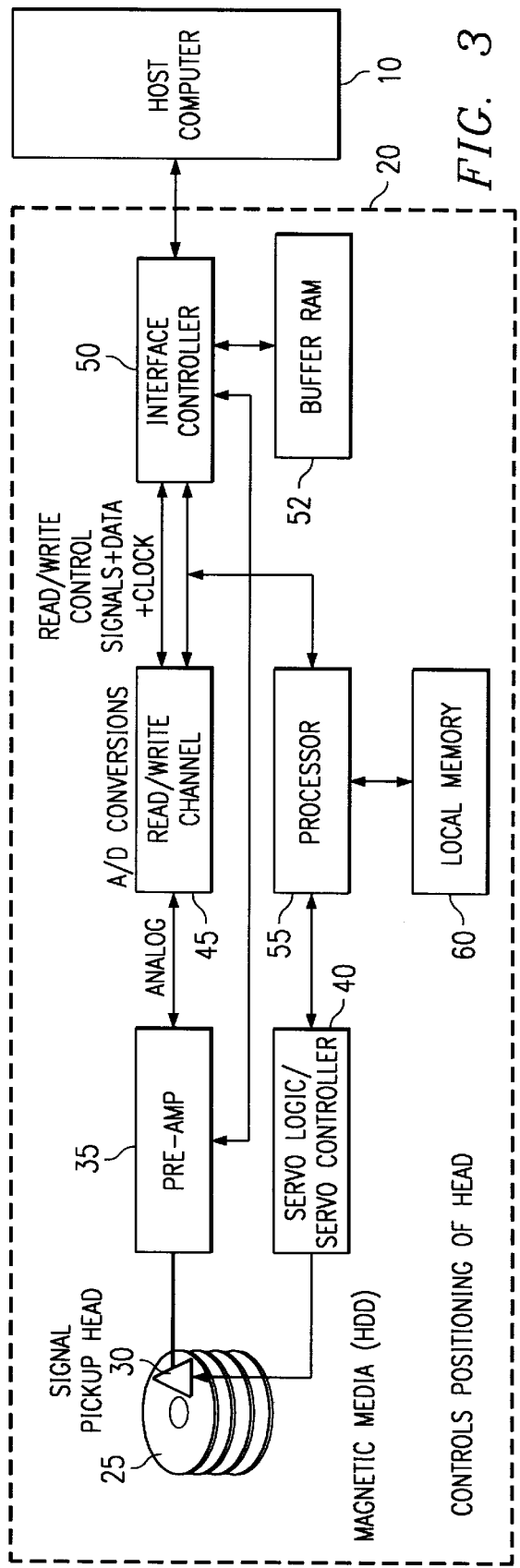
FIG. 3 shows a host computer and a hard disk drive system.

FIG. 3 depicts a host computer 10 which interacts with a hard disk drive system 20 of a type in which the present invention may be employed. The hard disk drive system 20 includes a plurality of magnetic disks 25 arranged along an axis which extends perpendicularly to the face of each disk.

The hard disk drive system 20 also includes at least one signal pick-up head 30, which is provided over the surface of one of the magnetic disks 25. Although there is a signal pick-up head 30 for each of the magnetic disks, to simplify FIG. 3 multiple signal pick-up heads are not shown. The signal pick-up head 30 reads data stored on the disk and outputs the data to a pre-amp 35, which amplifies the signal. The signal pick-up head 30 is controlled by the servo logic of a servo controller 40 that positions the signal pick-up head 30 accurately over a predetermined track of one of the magnetic disks 25.

The pre-amp 35 outputs an analog signal to a read/write channel 45 which extracts digital data (e.g., NRZ data) together with a clock signal from the analog signal. Thereafter, the digital data and clock are output from the read/write channel 45 to the interface controller 50 where sectors are formed.

A digital signal processor 55 (DSP or microcontroller) controls the overall disk drive operation including implementing servo control algorithms to seek, track, and control spindle speed. The DSP 55 also programs the read/write channel 45 and the interface controller 50. The DSP 55 has a corresponding local memory device 60 that includes static random access memory (SRAM), which is used as a scratch pad, and an erasable programmable memory (EPROM), which stores fixed content tables and programs.

The digital data and clock extracted by the read/write channel 45 are also output to an interface controller 50 which controls the flow of data from the magnetic disk read by the signal pick-up head 30. The interface controller 50 is connected to a memory buffer 52 which temporarily stores the extracted digital data to account for the transfer speed difference between the disk data rate and the host interface data rate. The memory buffer 52 may be a random access memory (RAM) chip, or more specifically, a dynamic random access memory (DRAM) chip.

The interface controller 50 is also connected to the host computer 10 so as to transmit data to the host computer 10 upon request. Although the reading of data from a magnetic disk has been described, the process can be reversed to write data sectors to a magnetic disk.

Figure 4:
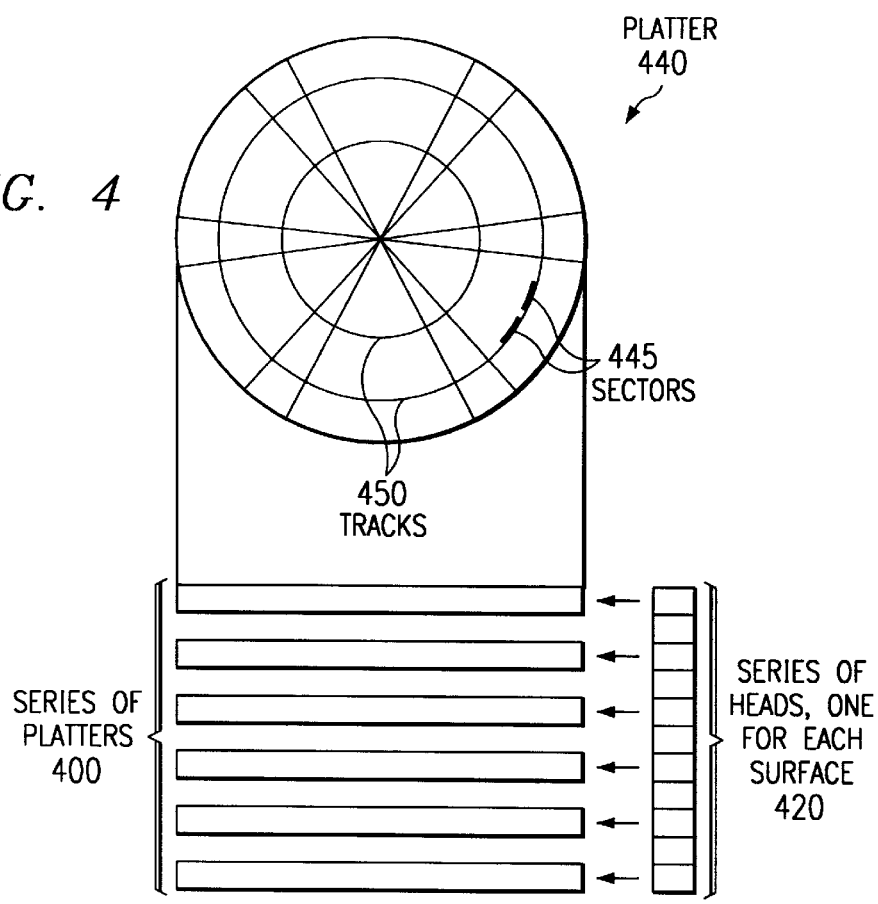
FIG. 4 shows a disk including radially concentric tracks.
Figure 5A:
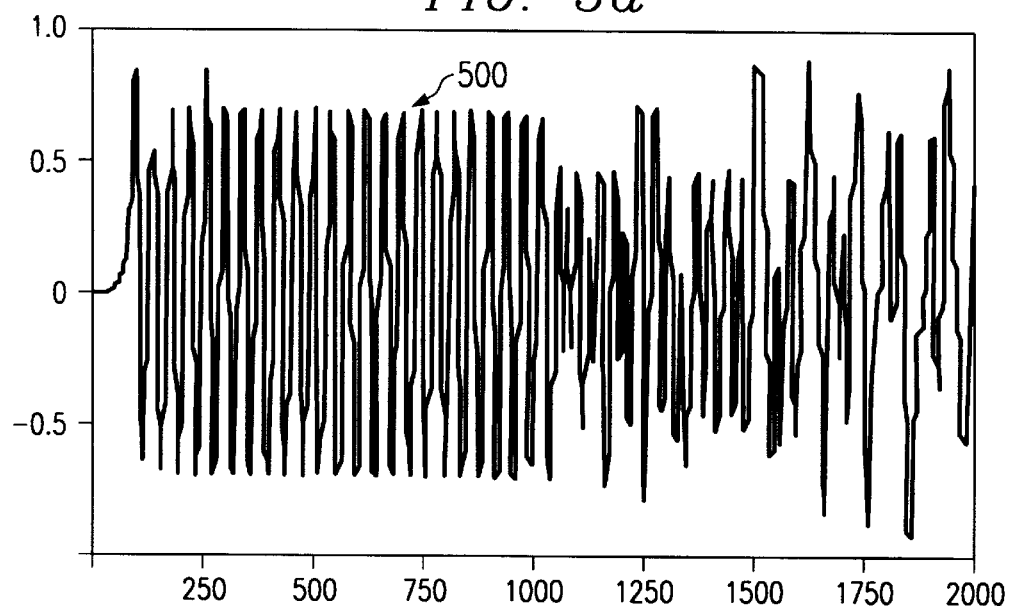
FIG. 5a shows a portion of a data signal including a preamble having a series of transitions which is employed for synchronization.
Figure 5B:
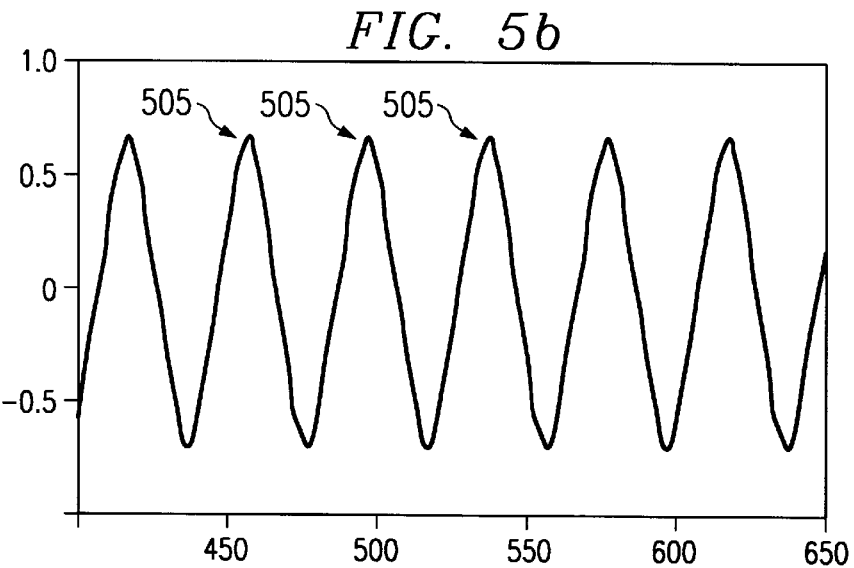
FIG. 5b shows the preamble of FIG. 5a in greater detail.

FIG. 4 depicts a stack of disks 400 (or platters) which may be used in conjunction with the hard disk drive system described above. Each of the disks have corresponding heads 420 and are formatted in the same manner. Accordingly, only the features of a single disk 440 are shown in greater detail. The disk 440 includes sectors 445 which are disposed along multiple tracks 450. At the beginning of each sector of data is a preamble 500, as shown in FIG. 5a. The preamble includes numerous transitions 505, as shown in FIG. 5b, that are used for the acquisition and tracking of input signals.

Figure 6:
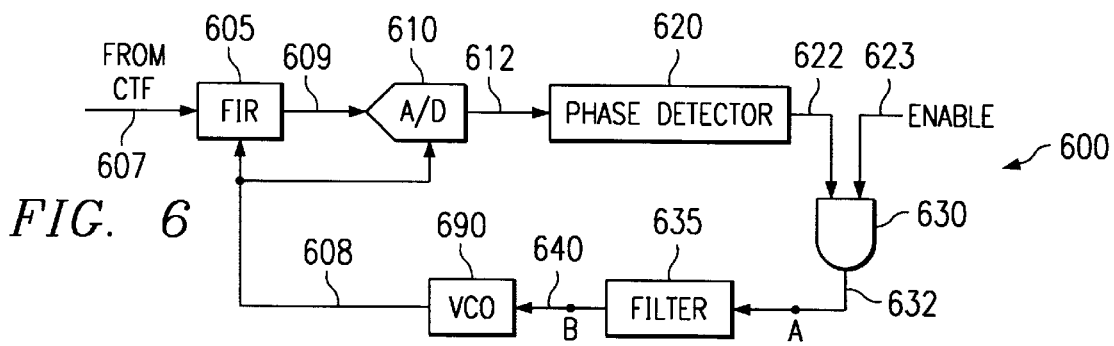
FIG. 6 shows a first embodiment of the present invention which may be included in the read/write channel of the hard disk drive system shown in FIG. 3.

FIG. 6 is a block diagram representation of a PLL system 600 used for timing recovery in a disk drive in accordance with a first embodiment of the present invention. The PLL system includes an analog FIR filter 605 which receives an analog-based input signal 607 and a feed back signal 608 and performs equalization on these signals. The feedback signal 608 is a PLL clock signal. The equalized signal 609 output by the FIR filter 605 is a product of the analog-based input signal 607 and the feedback signal 608.

The equalized signal 609 is received by an analog to digital ("A/D") converter 610 and converted into a digital signal 612 in accordance with the feedback signal 608. The digital signal 612 is received by a phase detector 620 which detects a phase difference therefrom and outputs a signal 622 reflecting the magnitude of that phase difference to an input of an AND gate 630. Another signal 623, ENABLE, is also input to the AND gate 630 and acts to enable or disable the PLL system 600.

If the PLL system 600 is enabled, then the signal 622 output by the phase detector 620 will be output as a signal 632 to a digital filter 635 which filters the signal 632 output by the AND gate 630. The signal 640 output by the filter 635 is, in turn, output to a voltage controlled oscillator 690, which produces the above-mentioned feedback signal 608 received by the FIR filter 600 and the A/D converter 610.

Figure 7:
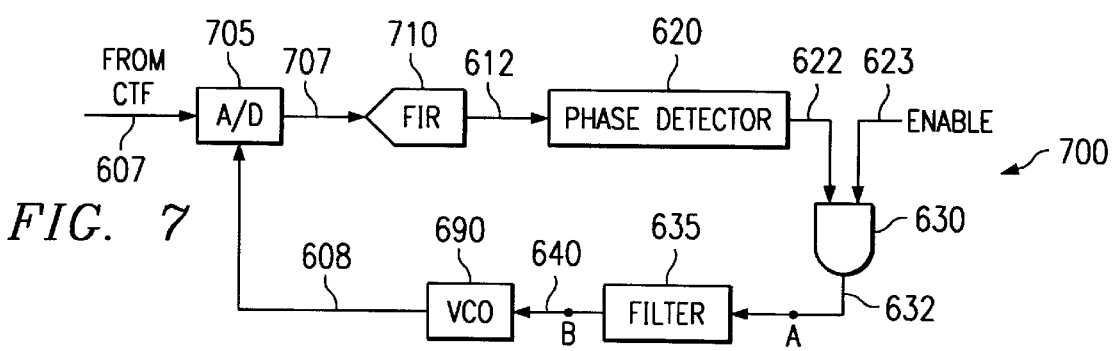
FIG. 7 shows a second embodiment of the present invention which may be included in the read/write channel of the hard disk drive system shown in FIG. 3.

FIG. 7 is a block diagram representation of a PLL system 700 used for timing recovery in a disk drive in accordance with a second embodiment of the present invention. The PLL system 700 shown in FIG. 7 includes a number of circuit elements which function in the same way as elements employed in the PLL system 600 shown in FIG. 6. Accordingly, those elements bear the same reference numerals and will not be described further to simplify the discussion of the second embodiment of the present invention.

The PLL system 700 of FIG. 7 includes an A/D converter 705 which receives an analog-based input signal 607 and a feedback signal 608 and converts these signals into digital signals 707. The digital signals 707 output by the A/D converter 705 are received by a digital FIR filter 710 which equalizes those digital signals and outputs an equalized signal 612 to a phase detector 620.

Figure 8:
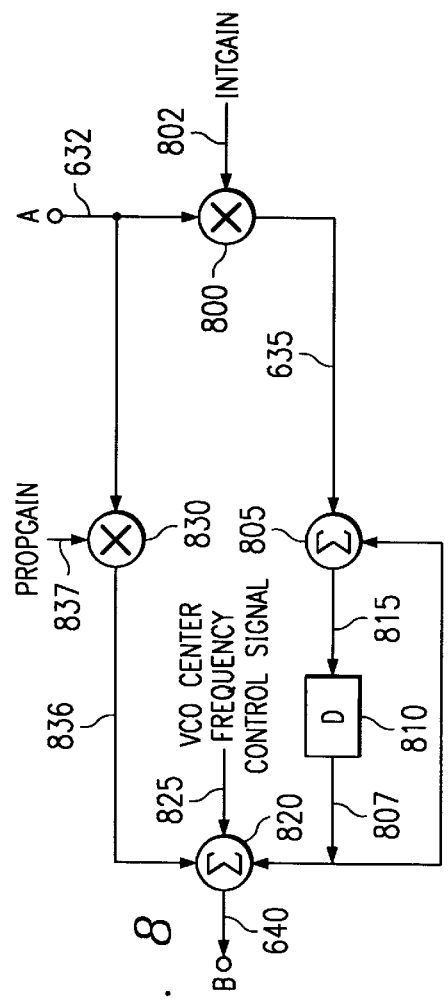
FIG. 8 shows a filter which may be employed in the first and second embodiments of the present invention shown in FIGS. 6 and 7, respectively.

FIG. 8 is a block diagram of a filter which may be employed as the filter 635 in the PLL systems 600 and 700 of FIGS. 6 and 7, respectively. The filter 635 includes a first multiplier 800 which multiplies the signal 632 output by an AND gate 530 (shown in FIGS. 6 and 7) with a signal 802, INTGAIN. The output signal 803 of the first multiplier 800 is received by a first adder 805 along with the output signal 807 of a buffer 810. The adder 805 adds the output signals 803 and 807 of the first multiplier 800 and the buffer 810, respectively, and outputs a signal 815 as a result to the buffer 810. The output signal 807 of the buffer 810 is received by a second adder 820 along with a VCO center frequency control signal 825. The second adder 820 also receives the output signal 836 of a second multiplier 830, which multiplies the output signal 632 of the AND gate 530 (shown in FIGS. 6 and 7) with a signal 837, PROPGAIN. The second adder 820 outputs the signal 640 described above.

As mentioned above, each of the elements of the PLL system have a latency associated therewith. The present invention reduces the latency of the PLL system by forcing the coefficients of the FIR filter to all zeroes with the exception of the very first coefficient which is set to one. In particular, the FIR filter performs equalization in accordance with a function defined by, for example, the following expression:

$$Y = \Sigma C_i X_{N-i}, \quad i=0 \text{ to } N-i, \text{ where } N \neq 0, C_0=1 \text{ and } C_1 \ldots C_{N-1}=0.$$

Significantly, only the first coefficient, $C_0$, of the above-mentioned expression is set equal to a value of one, while the remaining coefficients, $C_1 \ldots C_{N-1}$, are set equal to a value of zero. This constraint on the coefficients of the above-mentioned expression assures that the latency of the PLL system is reduced appropriately.

The present invention is well suited, but not limited to, a system in which the analog based FIR 605 (shown in FIG. 6) is implemented using a track and hold circuit. If, rather than bypassing the FIR 605, a track and hold circuit is coupled to an input of the A/D converter 610 during both the acquisition and tracking modes, the design of the A/D converter can be simplified.

If the FIR filter 605 is bypassed, then during the acquisition mode the A/D converter 610 would have to process an unfiltered signal while contending with the full slew rate of that signal. Consequently, the design of the A/D converter 610 would have to be more robust to cope with the increased demands associated with processing an unfiltered signal.

An additional advantage provided by the present invention lies in the fact that the signal received by the A/D converter 610 is always the same. This avoids the added complexity of a high speed analog multiplexor and the related issue of switching the FIR filter 600 out of the timing loop.

Another advantage lies in the fact that the reduced latency improves the effectiveness of "aided" acquisition techniques. By way of example, the effectiveness of a zero phase restart circuit, which is sensitive to the frequency offset existing between the VCO center frequency and the incoming data stream, is increased through the use of the present invention. However, this advantage also applies to the use of alternate PLL topologies, such as the one shown in FIG. 7.

Advantageously, the present invention may employ a single data path, which simplifies the design and makes the resulting system more apt for high speed applications. The present invention employs simplifying techniques while maximizing high speed.

Figure 9A:
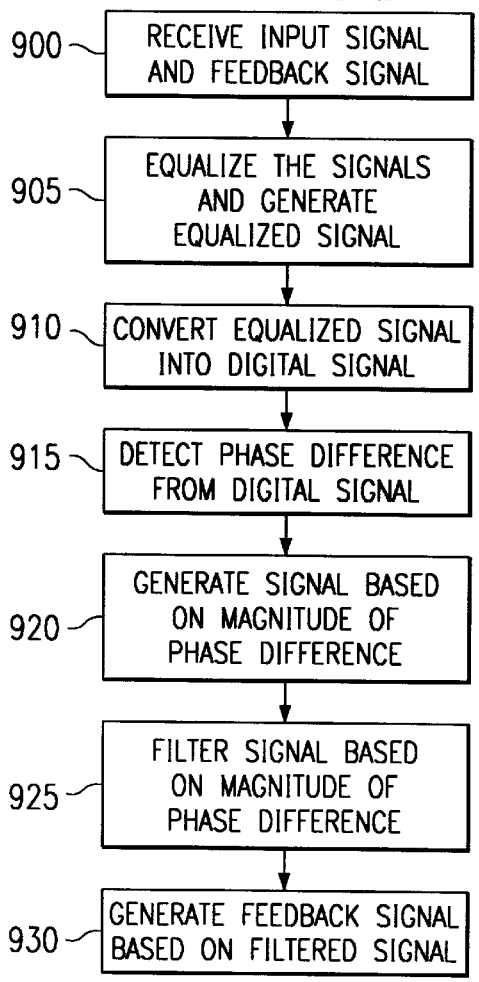
FIGS. 9a and 9b are flow charts depicting the steps of a method of the present invention, which may be implemented in software.

The present invention also encompasses a method for reducing the time required to acquire synchronization with an incoming data stream. In accordance with one embodiment of the present invention, a method is provided which will be discussed in connection with FIG. 9a.

In step 900, an analog-based input signal and a feedback signal are received. In step 905, equalization is performed on the analog-based input signal and the feedback signal in order to produce an equalized signal based on the analog-based input signal and the feedback signal.

In step 910, the equalized signal is converted into a digital signal. Thereafter, in step 915, a phase difference is detected from the digital signal and, in step 920, a signal corresponding to a magnitude of the phase difference is generated.

In step 925, the signal corresponding to a magnitude of the phase difference is filtered such that a filtered signal corresponding to a magnitude of the phase difference is produced. Thereafter, in step 930, the feedback signal is generated based on the filtered signal corresponding to a magnitude of the phase difference;

As noted above, the step of performing equalization (step 905) is performed in accordance with a function defined by an expression having a plurality of coefficients including a first coefficient. Significantly, the first coefficient is the only coefficient whose value is set equal to one and any remaining coefficients of the plurality of coefficients are set equal to a value of zero.

Figure 9B:
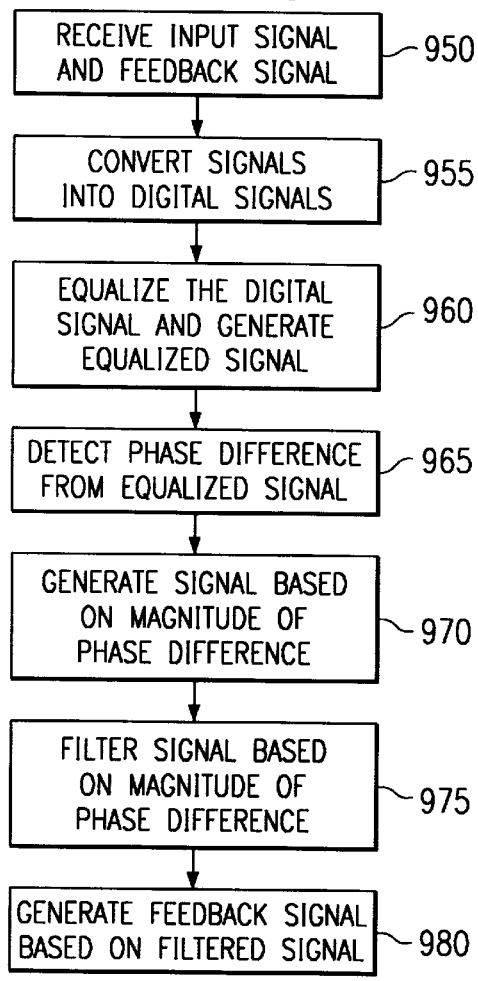

In accordance with another embodiment of the present invention, a method will be discussed below in connection with FIG. 9b. In step 950 an analog-based input signal and a feedback signal are received. Thereafter, in step 955, the analog-based input signal and feedback signal are converted into first and second digital signals, respectively. In step 960, equalization is performed on the first and second digital signals such that an equalized signal is generated based on the first and second digital signals.

Thereafter, in step 965, a phase difference is detected from the equalized signal and in step 970 a signal corresponding to a magnitude of the phase difference is generated.

In step 975 the signal corresponding to a magnitude of the phase difference is filtered such that a filtered signal corresponding to a magnitude of the phase difference is produced. Thereafter, in step 980, the feedback signal is generated based on the filtered signal corresponding to a magnitude of the phase difference. The step of performing equalization (step 960) is performed in the manner discussed above.

It will be apparent to those skilled in the art that various modifications and variations can be made to the apparatus and method of the present invention without departing from the spirit or scope of the invention. Thus, it is intended that the present invention cover all modifications and variations of this invention provided they come within the scope of the appended claims and their equivalents.

What is claimed is:

1. An apparatus for reducing the time required to acquire synchronization with an incoming data stream, said apparatus comprising:

a first filter which receives an analog-based input signal and a feedback signal, performs equalization on the analog-based input signal and the feedback signal, and outputs an equalized signal based on the analog-based input signal and the feedback signal;

an analog to digital converter which receives the equalized signal and the feedback signal and outputs a digital signal converted from the equalized signal in accordance with the feedback signal;

a phase detector which receives the digital signal, detects a phase difference therefrom and outputs a signal corresponding to a magnitude of the phase difference;

a second filter which receives and filters the signal corresponding to a magnitude of the phase difference and outputs a filtered signal corresponding to a magnitude of the phase difference; and a voltage controlled oscillator which receives the filtered signal corresponding to a magnitude of the phase difference and outputs the feedback signal;

wherein said first filter performs equalization on the analog-based input signal and feedback signal in accordance with a function defined by an expression comprising a plurality of coefficients including a first coefficient, wherein only the first coefficient of the plurality of coefficients is set to a value of one and any remaining coefficients of the plurality of coefficients are set to a value of zero.

2. The apparatus defined in claim 1, wherein said first filter comprises an analog finite impulse response filter.

3. The apparatus defined in claim 2, wherein said second filter comprises a digital filter.

4. The apparatus defined in claim 1, wherein the feedback signal is a PLL clock signal.

5. The apparatus defined in claim 4, wherein the equalized signal is a product of the analog-based input signal and the feedback signal.

6. An apparatus for reducing the time required to acquire synchronization with an incoming data stream, said apparatus comprising:

an analog to digital converter which receives an analog-based input signal and a feedback signal and outputs first and second digital signals converted from the analog-based input signal and the feedback signal, respectively;

a first filter which receives the first and second digital signals, performs equalization on the first and second digital signals and outputs an equalized signal based on said first and second digital signals;

a phase detector which receives the equalized signal, detects a phase difference therefrom and outputs a signal corresponding to a magnitude of the phase difference;

a second filter which receives and filters the signal corresponding to a magnitude of the phase difference and outputs a filtered signal corresponding to a magnitude of the phase difference; and a voltage controlled oscillator which receives the filtered signal corresponding to a magnitude of the phase difference and outputs the feedback signal;

wherein said first filter performs equalization on the first and second digital signals in accordance with a function defined by an expression comprising a plurality of coefficients including a first coefficient, wherein only the first coefficient of the plurality of coefficients is set to a value of one and any remaining coefficients of the plurality of coefficients are set to a value of zero.

7. The apparatus defined in claim 6, wherein said first filter comprises a digital filter.

8. The apparatus defined in claim 6, wherein said first filter comprises a digital finite impulse response filter.

9. The apparatus defined in claim 6, wherein said second filter comprises a digital filter.

10. The apparatus defined in claim 6, wherein the feedback signal comprises a PLL clock signal.

11. The apparatus defined in claim 10, wherein the equalized signal is a product of the first and second digital signals.

12. A method for reducing the time required to acquire synchronization with an incoming data stream, said method comprising the steps of:

receiving an analog-based input signal and a feedback signal;

performing equalization on the analog-based input signal and the feedback signal to produce an equalized signal based on the analog-based input signal and the feedback signal;

converting the equalized signal into a digital signal in accordance with the feedback signal;

detecting a phase difference from the digital signal and generating a signal corresponding to a magnitude of the phase difference;

filtering the signal corresponding to a magnitude of the phase difference and producing a filtered signal corresponding to a magnitude of the phase difference; and generating the feedback signal based on the filtered signal corresponding to a magnitude of the phase difference;

wherein said step of performing equalization is performed in accordance with a function defined by an expression comprising a plurality of coefficients including a first coefficient, wherein only the first coefficient of the plurality of coefficients is set to a value of one and any remaining coefficients of the plurality of coefficients are set to a value of zero.

13. The apparatus defined in claim 12, wherein said step of performing equalization is performed using an analog finite impulse response filter.

14. A method for reducing the time required to acquire synchronization with an incoming data stream, said method comprising the steps of:

receiving an analog-based input signal and a feedback signal;

converting the analog-based input signal and feedback signal into first and second digital signals, respectively;

performing equalization on the first and second digital signals and generating an equalized signal based on the first and second digital signals;

detecting a phase difference from the equalized signal and generating a signal corresponding to a magnitude of the phase difference;

filtering the signal corresponding to a magnitude of the phase difference and producing a filtered signal corresponding to a magnitude of the phase difference; and generating the feedback signal based on the filtered signal corresponding to a magnitude of the phase difference;

wherein said step of performing equalization is performed in accordance with a function defined by an expression comprising a plurality of coefficients including a first coefficient, wherein only the first coefficient of the plurality of coefficients is set to a value of one and any remaining coefficients of the plurality of coefficients are set to a value of zero.

15. The method defined in claim 14, wherein said step of performing is performed using a digital finite impulse response filter.

* * * * *